United States Patent [19]

Bullock

[11] 4,027,297
[45] May 31, 1977

[54] GAPLESS MAGNETIC BUBBLE PROPAGATION PATH STRUCTURE

[75] Inventor: David Carl Bullock, Richardson, Tex.

[73] Assignee: Texas Instruments Incorporated, Dallas, Tex.

[22] Filed: Feb. 3, 1975

[21] Appl. No.: 546,640

[52] U.S. Cl. .......................................... 340/174 TF
[51] Int. Cl.[2] ........................................ G11C 11/14
[58] Field of Search ................. 340/174 TF, 174 SR

[56] References Cited

UNITED STATES PATENTS

| | | | |
|---|---|---|---|
| 3,534,347 | 10/1970 | Bobeck | 340/174 TF |
| 3,828,329 | 8/1974 | Fischer et al. | 340/174 TF |
| 3,866,190 | 2/1975 | deJonge et al. | 340/174 TF |
| 3,914,751 | 10/1975 | Keefe | 340/174 TF |

OTHER PUBLICATIONS

IEEE Transactions on Magnetics, "X-Bar, a New Propagation Pattern for Magnetic Bubbles," by Parzefall, et al., vol. Mag-9, No. 3, 9/73; pp. 293-297.

Primary Examiner—James W. Moffitt
Attorney, Agent, or Firm—Harold Levine; James T. Comfort; William E. Hiller

[57] ABSTRACT

A gapless propagation path structure for magnetic bubbles in a magnetic bubble domain memory system employing permalloy elements, wherein the drive field requirements for the in-plane rotating magnetic field may be reduced for high magnetization materials. An overlay pattern of magnetizable material, e.g. permalloy, is provided on a layer of magnetic material of a type suitable for the propagation of magnetic bubble domains therein. The magnetizable overlay pattern includes respective magnetizable elements forming the propagation paths for the magnetic bubble domains, the elements being so arranged as to provide a continuous track of magnetizable material included in the magnetizable overlay pattern, thereby defining a gapless propagation path for the magnetic bubble domains. The in-plane rotating magnetic field within the plane of the magnetic layer on which the magnetizable overlay pattern is disposed causes magnetic bubble domains to travel along respective gapless propagation paths included in the magnetic bubble domain memory system, there being respective movement-controlling elements associated with the gapless propagation paths for maintaining the magnetic bubble domains in motion along the selected bubble propagation path therefor.

4 Claims, 4 Drawing Figures

GAPLESS MAGNETIC BUBBLE PROPAGATION PATH STRUCTURE

BACKGROUND OF THE INVENTION

1. FIELD OF THE INVENTION

This invention relates to magnetic bubble domain memory systems that depend upon the generation and propagation of magnetic bubble domains in the processing of data, and more particularly to a bubble propagation path structure of gapless configuration along which magnetic bubble domains may be selectively propagated with reduced drive field requirements.

2. DESCRIPTION OF THE PRIOR ART

Magnetic bubble domain technology involves the processing of data by the storage of data bits in the form of magnetic bubbles which are moveable in a thin film of magnetic material. These magnetic bubbles are cylindrical magnetic domains whose polarization is opposite to that of the thin magnetic film or layer in which they are disposed. The magnetic film or layer is made of a material which causes the film to have magnetically easy directions essentially perpendicular to the plane of the film. The magnetic properties of this film, e.g. magnetization, anisotropy, coercivity, mobility, are such that the film may be maintained magnetically saturated with magnetization in a direction out of the plane and that small localized regions of polarization aligned opposite to the general polarization direction may be supported. Such localized regions are the magnetic bubble domains of generally cylindrical configuration referred to previously.

These magnetic bubbles can be manipulated by varying the surrounding magnetic field. For example, the magnetic bubbles may be formed in thin platelets having uniaxial anisotropy with the easy magnetic axis perpendicular to the platelet or film which may comprise such material as rare earth orthoferrites, rare earth aluminum and gallium substituted iron garnets and rare earth cobalt or iron amorphous alloys. Since the magnetic bubbles can be generated, propagated, erased, replicated, and manipulated to form data processing operations and their presence and absence detected, these bubbles may be utilized to perform many of the on-off or primary functions necessary in a binary computer operation.

The relative size of the individual magnetic bubble domains is determined by the strength of the external bias magnetic field perpendicular to the magnetic film. As this external bias magnetic field is increased in strength, the magnetic bubbles are initially caused to form as localized regions at a certain field strength. Continued increase in the strength of the external magnetic field causes the individual bubbles to shrink until they completely disappear.

Typically, the controlled movement of such magnetic bubble domains is accomplished by employing an overlay pattern of magnetizable material (e.g. permalloy) on the surface of the magnetic layer in which the magnetic bubble domains are disposed. This magnetizable overlay pattern is capable of generating magnetic poles in response to magnetic fields in the plane of the magnetic layer and the overlay material. An in-plane rotating magnetic field within the plane of the magnetizable overlay pattern is provided for the purpose of moving bubble domains along selected bubble propagation paths. The rotation of the in-plane magnetic field causes it to be re-oriented, thereby causing movement of the magnetic poles generated in the permalloy material of the magnetizable overlay pattern. Consequently, the magnetic bubble domains are also caused to move by virtue of being attracted by the pulls generated in the permalloy material in response to the changing positions of the in-plane magnetic field.

Heretofore, a common form of the magnetizable overlay pattern defining the bubble propagation paths in a magnetic bubble domain system has comprised alternating series of bar shaped and T-shaped permalloy overlay elements which are respectively spaced apart providing gaps therebetween. This type of arrangement provides a bubble propagation path in which the magnetic bubbles may be propagated in either direction along the path in response to the orientation of the in-plane rotating magnetic field. Such bubble propagation path structures have been satisfactory when employed with magnetic bubble domains having a diameter of about 5 microns which would be formed by an external bias magnetic field of approximately 200 gauss applied perpendicular to the magnetic film. In this connection, the gaps between successive magnetizable elements defining the bubble propagation path form energy barriers that hinder movement of the respective bubbles thereacross. However, the magnitude of such energy barriers in relation to the 5 micron diameter bubbles is relatively low so as to offer no appreciable resistance to the passage of the respective bubbles thereacross. Therefore, a high driving requirement from the in-plane rotating magnetic field has not been necessary to impart movement to the individual bubbles across the gaps in the propagation paths.

In order to achieve conservation in space of such magnetic bubble domain memory systems, efforts have been made to reduce the diameter of individual magnetic bubble domains so as to afford a more closely packed arrangement of such bubbles in a memory system. This enables the total number of bits in such a memory system to be substantially increased without a corresponding increase in the size of the memory system. To this end, the average bubble diameter has been reduced to the size of about 0.5 microns in some instances, as obtained through the imposition of an external bias magnetic field of increased strength to approximately 1600 gauss on the magnetic film in which the bubbles are disposed. However, the energy barriers existing in the gaps between conventional bubble propagation path structures employing spaced apart elements of a magnetizable overlay pattern become a more significant problem upon the reduction in size of the individual magnetic bubbles. In this respect, each of the energy barriers is proportional to the external fringing magnetic field from the surface poles of the bubbles. Thus, the energy barriers across the gaps in a bubble propagation path are significantly higher where magnetic bubbles of 0.5 microns in diameter are employed and must be moved across the succession of gaps existing between the magnetizable elements of the magnetizable overlay pattern defining the bubble propagation path. Consequently, relatively high drive requirements are imposed on the in-plane rotating magnetic field in order to permit the smaller-sized magnetic bubble domains to successfully traverse the gaps in the bubble propagation path along which they are intended to travel.

SUMMARY OF THE INVENTION

In accordance with the present invention, a propagation path structure for magnetic bubble domains has been developed, wherein the magnetizable overlay pattern provided on one surface of the layer of magnetic material in which magnetic bubble domains can be propagated is so arranged as to provide continuous tracks of magnetizable material defining respective bubble propagation paths and along which the movement of magnetic bubble domains can be controlled. Such a structure avoids the energy barriers associated with the gaps in the bubble propagation paths defined by magnetizable overlay patterns of conventional structure, such as the alternating series of bar elements and T-elements commonly employed.

In a specific embodiment of the invention, the magnetizable overlay pattern provided on the layer of magnetic material in which magnetic bubble domains can be propagated comprises repetitive segments providing respective continuous tracks of magnetizable material in which the gaps between adjacent segments have been eliminated. The continuous tracks of magnetizable material define bubble propagation paths along which the magnetic bubble domains are adapted to travel under the driving influence of an in-plane rotating magnetic field. Specifically, each continuous track of magnetizable material may be derived from an alternating sequence of chains of spaced bar elements and spaced H-elements of magnetizable material, wherein the H-elements are disposed on their sides so as to arrange the respective cross-arms thereof in substantially parallel relationship to the bar elements included in the respective chains of bar elements disposed above and below the chain of H-elements. The upper and lower arms of each of the H-elements engage successive bar elements of the upper and lower chains thereof, with the bubble propagation path structure being defined as a series of steps along the arms of the H-elements wherein respective bar elements bridge the space between the corresponding arms of adjacent H-elements in a chain thereof. Movement of a magnetic bubble along the bubble propagation path as defined thereby is controlled by providing each H-element with a diagonal element of magnetizable material extending between the upper and lower arms thereof and intersecting with the cross-arm thereof, the diagonal element of magnetizable material associated with the H-element assuring consecutive motion of the magnetic bubble along the selected propagation path in a manner to be hereinafter described.

The gapless bubble propagation path structure as herein disclosed enables the diameter size of the bubbles employed in a magnetic bubble domain memory system to be reduced without imposing substantially higher driving requirements on the in-plane rotating magnetic field. Thus, memory systems with substantially enhanced bit capacity are possible by employing magnetic bubbles of reduced diameter in conjunction with the gapless bubble propagation path structure to form the major/minor loops to be traversed by the bubbles in performing data processing operations without a corresponding increase in memory size.

DETAILED DESCRIPTION

Referring more specifically to the drawings, it will be understood that the present invention is concerned with the provision of a so-called gapless bubble propagation path for use in a magnetic bubble domain system of the general type described in the article "Magnetic Bubbles" - Bobeck et al, published in Scientific American, pages 78–90 (June 1971). A memory chip as employed in such a magnetic bubble domain system comprises a substrate of monocrystalline non-magnetic material which is overlaid with an epitaxial layer or film of magnetic material of a type in which magnetic bubble domains can be propagated. Preferably, the magnetic material of the layer is a rare earth iron garnet film which may be of the following composition $(YGdTm)_3 (FeGa)_5O_{12}$, for example.

Figure 1:
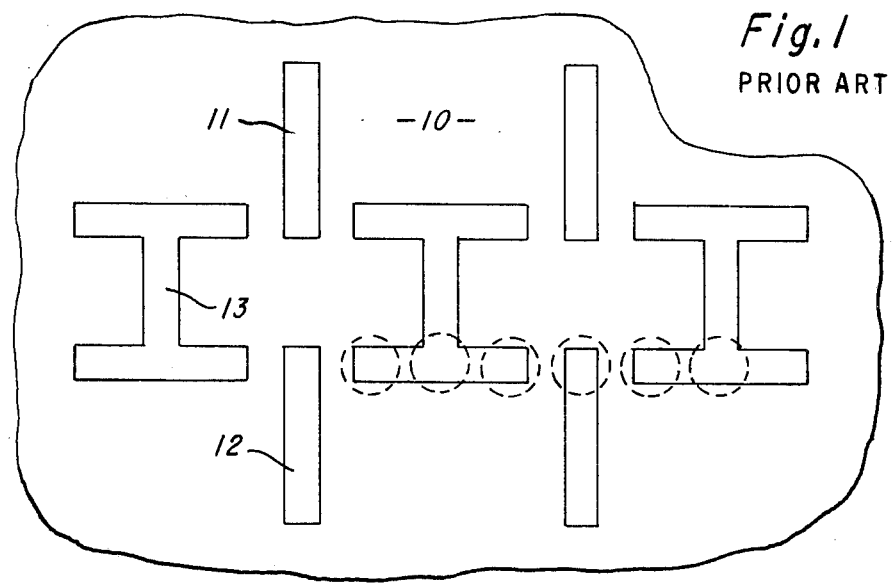
FIG. 1 is a plan view of a typical magnetizable overlay pattern as disposed on the surface of a layer of magnetic material in which magnetic bubble domains can be propagated, the magnetizable overlay pattern having gaps between adjacent elements of magnetizable material included therein.

FIG. 1 illustrates a conventional bubble propagation path structure as formed by a magnetizable overlay pattern on one surface of the layer 10 of magnetic bubble-supporting magnetic material, the magnetizable overlay pattern being of the type generally shown in U.S. Pat. No. 3,714,420 Eisenberger et al issued on Jan. 30, 1973 and containing repetitive segments of magnetizable material, wherein the respective segments are spaced from each other to form gaps therebetween. To this end, FIG. 1 illustrates first and second series of bar elements 11, 12, with a series of H-elements 13 being disposed therebetween. Magnetic bubbles as indicated by the dotted line circles are intended to be moved along a bubble propagation path alternatively including a side arm of each respective H-elements 13 and an end portion of a bar element 11 as interposed between successive H-elements 13 in spaced relationship to define respective gaps therebetween. While this type of bubble propagation path structure is commonly employed with magnetic bubble domains having an average diameter of 5 microns (as determined by an external bias magnetic field strength of approximately 200 gauss, for example, applied perpendicular to the bubble-supporting magnetic layer 10) because of a relatively small energy barrier caused by each gap, the transition of magnetic bubble domain memory systems to use with magnetic bubble domains of considerably reduced diameter of the order of 0.5 microns caused by the imposition of an higher $4\pi M_s$ of substantially increased strength thereagainst (e.g. 1600 gauss) has caused the energy barriers created by these gaps to be substantially higher. In the latter respect, the energy barriers caused by the gaps are proportional to the strength of the magnetization of the bubble supporting material 10. Accordingly, the drive requirements for moving magnetic bubbles of substantially reduced diameter across the gaps between successive magnetizable elements defining the bubble propagation path structure are correspondingly increased to levels of high proportions.

Figure 2:
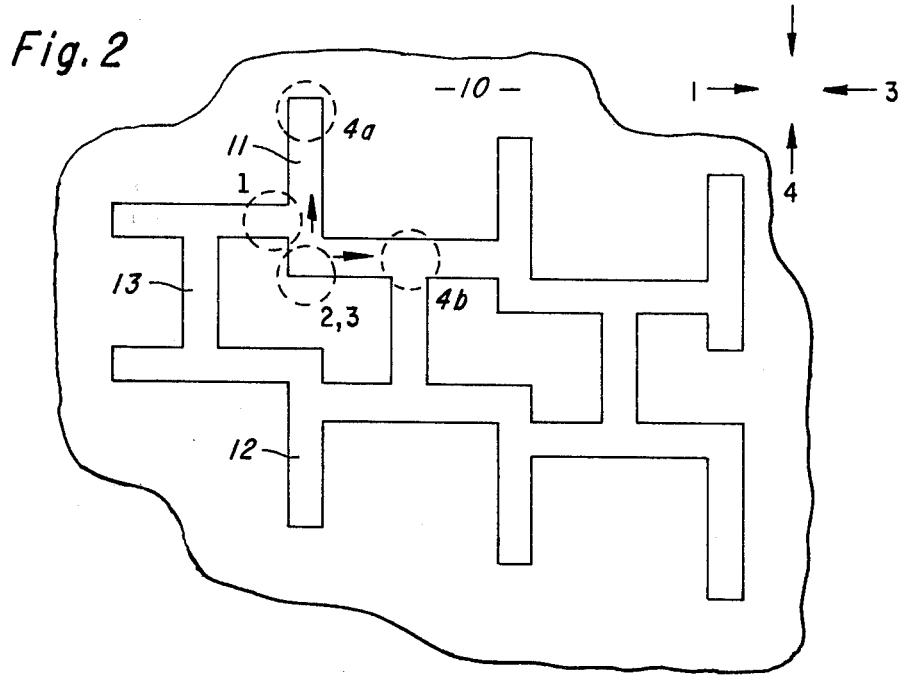
FIG. 2 is a view similar to FIG. 1, but showing interengagement between the respective elements of magnetizable material included in a magnetizable overlay pattern disposed on the magnetic bubble domain-supporting layer of magnetic material to facilitate and understanding of the present invention.

It will be understood that an in-plane rotating magnetic field within the plane of the magnetic layer 10 and the magnetizable overlay pattern including the repetitive elements 11, 12, and 13 induces poles in the respective magnetizable segments depending upon its orientation. By rotating the in-plane magnetic field through a complete cycle, the respective magnetic bubbles are caused to move along a selected bubble propagation path. This is graphically illustrated in FIG. 2, wherein a magnetizable overlay pattern is depicted in which the individual bar elements 11, 12 and H-elements 13 are arranged in respective engagement with each other so as to eliminate gaps between adjacent segments of the overlay pattern. The in-plane magnetic field as previously explained may be considered as comprising four phases designated by the respective arrows numbered 1, 2, 3 and 4. Assume that a single magnetic bubble domain is being tracked on the bubble propagation path structure depicted in FIG. 2. At position 1 of the bubble designated by the dotted line circle 1 corresponding to the field orientation designated 1, the magnetic bubble is located at the juncture between the upper arm of the H-shaped element 13 and intermediate location on the upper vertical bar element 11. Upon rotating the magnetic field to orientation 2, and assuming that positive poles attract bubble domains, the magnetic bubble domain is caused to move to a new position designated by the dotted line circle 2, wherein the bubble is disposed at the juncture of the lower end of the bar element 11 and the upper arm of a second H-element 13. The magnetic bubble remains in essentially the same location as the magnetic field is rotated to orientation 3. As the magnetic field continues rotation between orientation positions 3 and 4, the bubble has a tendency to be moved in two separate directions, upward along the vertical bar 11 and laterally along the upper arm of the second H-element 13 as depicted by the respective arrows to the possible dotted line circle positions 4a and 4b. Accordingly, the bubble movement during the portion of the cycle of rotation for the in-plane magnetic field between field orientation 3 and 4 is unstable, and the bubble has a tendency to oscillate, exhibiting little or no linear translation movement. This problem associated with a gapless bubble propagation path of the type depicted in FIG. 2 has perhaps been responsible for the continued use of the conventional bubble propagation path structure shown in FIG. 1, wherein gaps are formed between the individual segments comprising the magnetizable overlay pattern disposed on the bubble-supporting magnetic layer 10.

Figure 3:
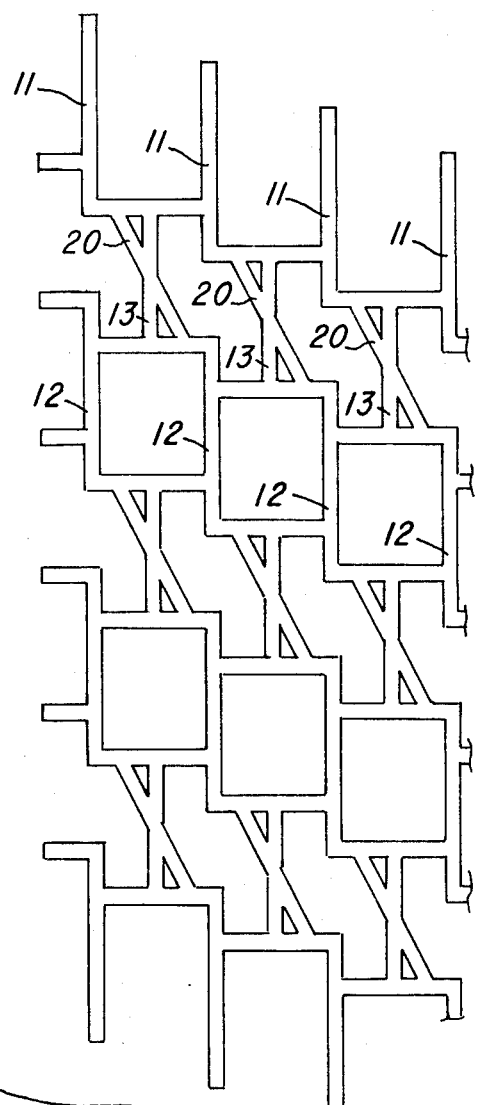
FIG. 3 is a plan view of a section of a magnetic bubble domain memory system employing a magnetizable overlay pattern on a layer of magnetic bubble domain-supporting magnetic material, wherein the magnetizable overlay pattern is constructed in accordance with the present invention to define continuous tracks of magnetizable material defining bubble propagation paths.
Figure 4:
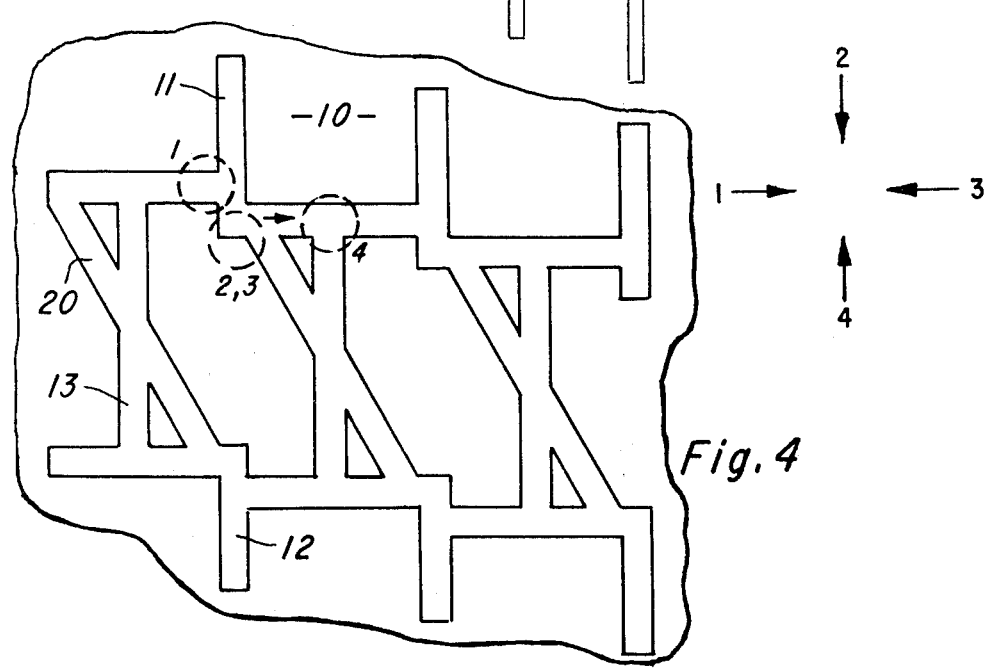
FIG. 4 is a fragmentary view of a portion of the structure illustrated in FIG. 3, partially diagrammatic in form, to illustrate movement of magnetic bubble domains along a bubble propagation path in accordance with the present invention.

In accordance with the present invention, I have determined that a gapless bubble propagation path structure may be formed to accommodate magnetic bubbles of reduced diameter, thereby eliminating the energy barriers caused by the gaps formed in conventional bubble propagation path structures and avoiding the necessity for a relatively high drive requirement from the in-plane magnetic field. To this end, the magnetizable overlay pattern is so constructed as to provide continuous tracks of magnetizable material extending along interengaging repetitive segments of the pattern, wherein means are provided in the pattern for controlling movement of a magnetic bubble domain to occur along the bubble propagation path defined thereby. Referring to FIGS. 3 and 4, a specific embodiment of the present invention is illustrated, wherein the bubble movement-controlling means associated with the magnetizable overlay pattern comprises respective diagonal members 20 of magnetizable material extending from one end of the upper arm of an H-element 13 to the opposite end of the lower arm thereof, intersecting with the cross-arm. These bubble movement-controlling diagonal members 20 so alter the effect of the in-plane rotating magnetic field in its movement between orientation positions 3 and 4 to cause the magnetic bubble to move from the dotted line circle position 2, 3 in a direction along the upper arm of the next adjacent H-element 13 in the direction of the arrow to the dotted line circle position 4. Thus, the respective diagonal members 20 associated with the H-elements 13 are responsible for providing consecutive motion of the magnetic bubbles along a selected propagation path in response to rotation of the in-plane magnetic field through a complete cycle.

It will be understood that the present invention may be incorporated in a magnetic bubble domain memory system including the usual structures for bubble generation, annihilation, replication, as employed in data processing. The gapless bubble propagation path disclosed herein permits the use of magnetic bubbles of reduced diameter size of the order of 0.5 microns, for example, without the necessity of high drive requirements from the in-plane rotating magnetic field. Reduction in the size of the magnetic bubbles employed in such a system enables much higher bit density to be accommodated per unit area of bubble-supporting magnetic material comprising the memory chips. Any suitable path configuration may be adopted for the gapless bubble propagation path structure of this invention. For example, the gapless bubble propagation paths may be arranged in a major loop/minor loops configuration, wherein the major loop is elongated, and a plurality of minor loops are disposed in parallel relationship along one side thereof in a manner well known in the art.

While a particular embodiment of the invention has been shown, it will be understood that various modifications may become apparent to those skilled in the art without departing from the spirit and scope of the invention which is defined by the appended claims.

I claim:

1. In a magnetic bubble domain system including a substrate of mono-crystalline non-magnetic material, an epitaxial layer of magnetic material disposed on said substrate and in which magnetic bubble domains can be propagated, and a magnetizable overlay pattern on one surface of said layer and having a magnetization in the plane of said overlay pattern for defining propagation paths for magnetic bubble domains, wherein said magnetizable overlay pattern comprises respective chains of spaced bar elements arranged in an alternating sequence with respective chains of spaced H-elements, said H-elements being disposed on their sides so as to arrange the respective cross-arms thereof in substantially parallel relationship to the bar elements included in the respective chains of bar elements, the upper arm of each of said H-elements engaging a respective bar element at an end portion thereof and engaging the next successive bar element in the same chain at a location intermediate the ends thereof, the lower arm of each of said H-elements engaging a respective bar element at a location intermediate the ends thereof and engaging the next successive bar element in the same chain at an end portion thereof.

the upper and lower arms of said H-elements in the same chain thereof being in engagement with bar elements of different chains of bar elements, means for providing an in-plane rotating magnetic field within the plane of said magnetic layer and said magnetizable overlay pattern disposed thereon, and means associated with each of said H-elements controlling movement of a magnetic bubble domain along a continuous track of magnetizable material, with said means defining a selected bubble propagation path comprising further magnetizable elements included in said magnetizable overlay pattern, said further magnetizable elements being diagonal members respectively corresponding to each of said H-elements, each said diagonal member extending from one end of the upper arm to the outer end of the lower arm and intersecting the cross-arm of the corresponding H-element.

2. In a magnetic bubble domain system as set forth in claim 1, wherein said bar elements, said H-elements, and said diagonal members included in said magnetizable overlay pattern are integrally related.

3. In a magnetic bubble domain system as set forth in claim 2, wherein said magnetizable overlay pattern is made of permalloy.

4. In a magnetic bubble domain system including a layer of magnetic material in which magnetic bubble domains can be propagated, and a magnetizable overlay pattern on one surface of said layer and having a magnetization in the plane of said overlay pattern for defining propagation paths for magnetic bubble domains, wherein said magnetizable overlay pattern comprises respective chains of spaced bar elements arranged in an alternating sequence with respective chains of spaced H-elements.

said H-elements being disposed on their sides so as to arrange the respective cross-arms thereof in substantially parallel relationship to the bar elements in the respective chains of bar elements, the upper arm of each of said H-elements engaging a respective bar element at an end portion thereof and engaging the next successive bar element in the same chain at a location intermediate the ends thereof, the lower arm of each of said H-elements engaging a respective bar element at a location intermediate the ends thereof and engaging next successive bar element in the same chain at an end portion thereof, the upper and lower arms of said H-elements in the same chain thereof being in engagement with bar elements of different chains of bar elements, and means associated with each of said H elements for controlling movement of a magnetic bubble domain along a continuous track of magnetizable material, with said means defining a selected bubble propagation path in response to an in-plane rotating magnetic field comprising further magnetizable elements included in said magnetizable overlay pattern, said further magnetizable elements being diagonal members respectively corresponding to each of said H-elements, each said diagonal member extending from one end of the upper arm to the other end of the lower arm and intersecting the cross-arm of the corresponding H-element.

* * * * *